United States Patent [19]

Huang

[11] Patent Number: 5,326,722
[45] Date of Patent: Jul. 5, 1994

[54] POLYSILICON CONTACT

[75] Inventor: Heng-Sheng Huang, Taipei, Taiwan

[73] Assignee: United Microelectronics Corporation, Hsinchu, Taiwan

[21] Appl. No.: 5,079

[22] Filed: Jan. 15, 1993

[51] Int. Cl.$^5$ ............................................. H01L 21/329
[52] U.S. Cl. ...................... 437/186; 437/968; 437/983; 437/31; 437/239
[58] Field of Search .......................... 437/186, 967; 148/DIG. 20, DIG. 30, DIG. 35, DIG. 118, DIG. 122, DIG. 123, DIG. 157

[56] References Cited

U.S. PATENT DOCUMENTS

| | | |
|---|---|---|
| 4,329,706 | 5/1982 | Crowder et al. |
| 4,354,309 | 11/1982 | Gardiner et al. |
| 4,358,326 | 11/1982 | Doo |
| 4,597,159 | 7/1986 | Usami et al. |
| 4,800,179 | 1/1989 | Mukai |
| 4,829,024 | 5/1989 | Klein et al. |
| 5,093,700 | 3/1992 | Sakata |
| 5,192,708 | 3/1993 | Beyer et al. |
| 5,236,850 | 8/1993 | Zhang |
| 5,238,849 | 8/1993 | Sato |

OTHER PUBLICATIONS

G. Akinai, et al. "NiSi$_2$ON Si(111), I. Effects of Substrate Cleaning Procedure and Reconstruction" *Surface Science* 193 (1988) pp. 534–548.

*Primary Examiner*—Olik Chaudhuri
*Assistant Examiner*—C. Everhart
*Attorney, Agent, or Firm*—George O. Saile

[57] ABSTRACT

A new method of forming polysilicon buried contact to source/drain or emitter regions is described. A silicon oxide layer is formed over the silicon substrate. An opening is formed to the silicon substrate at the location of the desired buried contact to source/drain or emitter region via conventional techniques. A hydrofluoric acid solution is used to remove the native silicon oxide which forms on the exposed surface of the silicon substrate. Some native silicon oxide is formed in a controlled manner again on the surface of the silicon substrate. The wafer is put into a low pressure chemical vapor deposition (LPCVD) apparatus and a layer of undoped polysilicon or amorphous silicon is deposited. An oxidizer is added to the deposition chamber or the wafer is exposed to ambient air so that a thin layer of native silicon oxide is formed in a controlled manner overlying the polysilicon layer. Additional alternating layers of polysilicon and native silicon oxide are formed as desired. The wafer is annealed at between about 800° to 1000° C. This causes, it is believed, the silicon oxide gas from the multiple native silicon oxide very thin layers to be exhausted resulting in the removal of all silicon oxide islands within the interface between the polysilicon and the buried contact to source/drain or emitter regions. Ions are implanted through the polysilicon layer or layers in the opening to the silicon substrate to form the source and drain regions.

23 Claims, 6 Drawing Sheets

POLYSILICON CONTACT

BACKGROUND OF THE INVENTION

(1) Field of the Invention

The invention relates to the fabrication of integrated circuit devices, and more particularly, to a method of forming buried contact or a contact to the emitter regions of a bipolar transistor in the fabrication of integrated circuits.

(2) Description of the Prior Art

A typical buried contact process flow is to form an opening to the silicon substrate over the planned source/drain regions of a field effect transistor or emitter regions of a bipolar transistor, then deposit a doped layer of polysilicon over and on the planned regions. The structure is heated and the source/drain regions or emitter regions are formed by outdiffusion from the doped polysilicon layer. The doped polysilicon layer is allowed to remain on the source/drain regions or emitter regions as their contacts. This is called the buried contact process.

In forming buried contact to source/drain or emitter regions, some native silicon oxide forms on the surface of the silicon substrate. This results in some residue islands of silicon oxide in the polysilicon crystal interface which increases the contact resistance or the emitter resistance/current rating. Workers in the art believe that it is desirable to remove this native silicon oxide.

Some workers in the field have addressed this issue of unwanted silicon oxide. U.S. Pat. No. 4,597,159 to Usami et al describes a process of forming a semiconductor device in which the atmosphere in which a polysilicon film is deposited does not contain sufficient oxygen for oxidation of the polysilicon to take place. U.S. Pat. No. 4,800,179 to Mukai describes a process for removing native oxide formed on an aluminum layer via laser pulses through a second aluminum layer. Akinci et al show that a contaminating silicon oxide layer can be removed by annealing at approximately 850° C. for 2 to 10 minutes. ("NiSi$_2$ On Si(111): 1. Effects of substrate cleaning procedure and reconstruction," by G. Akinci, T. R. Ohno, and Ellen D. Williams, *Surface Science* 193 (1988) p. 534–548, North-Holland, Amsterdam).

The process of the present invention utilizes a multiple layer structure. Multiple layers have been used in a number of U.S. Patents, although they are composed of different materials and/or they are used for different purposes that those of the present invention. For example, U.S. Pat. No. 4,829,024 to Klein et al describes a process of forming a metal barrier layer within a contact opening followed by the deposition and etchback of multiple polysilicon layers in order to limit grain size in the polysilicon layers. U.S. Pat. No. 4,354,309 to Gardiner et al describes a multiple polysilicon layer used in forming a gate which reduces grain growth and void formation in the polysilicon. U.S. Pat. No. 4,329,706 to Crowder et al details an improved interconnection for semiconductor integrated circuits using layers of polysilicon and metal silicide. U.S. Pat. No. 5,093,700 to Sakata describes a gate structure formed using multiple alternating layers of polysilicon and silicon oxide to reduce grain size and improve resistance of the transistor.

The problem of native oxide islands within the polysilicon and buried contact to source/drain or emitter region interface remains to be addressed by the present invention.

SUMMARY OF THE INVENTION

A principal object of the present invention is to provide a method of improving the quality of the interface between the polysilicon and the buried contact to source/drain or emitter region of an integrated circuit by removing all residual silicon oxide islands within the interface.

In accordance with the object of this invention a new method of forming polysilicon buried contact to source/drain or emitter regions is achieved. A silicon oxide layer is formed over the silicon substrate. An opening is formed to the silicon substrate at the location of the desired buried contact to source/drain or emitter region via conventional lithography and etching techniques. Some native silicon oxide forms on the exposed surface of the silicon substrate. A hydrofluoric acid solution is used to remove this native silicon oxide. The wafer is rinsed and spin dried. Some native silicon oxide is formed in a controlled manner again on the surface of the silicon substrate after this process. The wafer is put into a low pressure chemical vapor deposition (LPCVD) apparatus and a layer of undoped polysilicon or amorphous silicon is deposited. An oxidizer is added to the deposition chamber or the wafer is exposed to ambient air so that a thin layer of native silicon oxide is formed in a controlled manner overlying the polysilicon layer. Additional alternating layers of polysilicon and native silicon oxide are formed as desired. The wafer is annealed at between about 800° to 1000° C. This causes, it is believed, the silicon oxide gas from the multiple native silicon oxide very thin layers to be exhausted resulting in the removal of all silicon oxide islands within the interface between the polysilicon and the buried contact to source/drain or emitter regions. Ions are implanted through the polysilicon layer or layers in the opening to the silicon substrate to form the source and drain regions. The structure is heated to cause the formation of the buried region under the buried contact by outdiffusion from the buried contact layer and to make electrical contact to at least one of the adjacent source and drain regions. This completes the formation of the buried contact to the source/drain. The emitter contact to the emitter region is not expanded as is done with the formation of source/drain regions as described above.

BRIEF DESCRIPTION OF THE DRAWINGS

In the accompanying drawings forming a material part of this description, there is shown.

DESCRIPTION OF THE PREFERRED EMBODIMENTS

Figure 1:
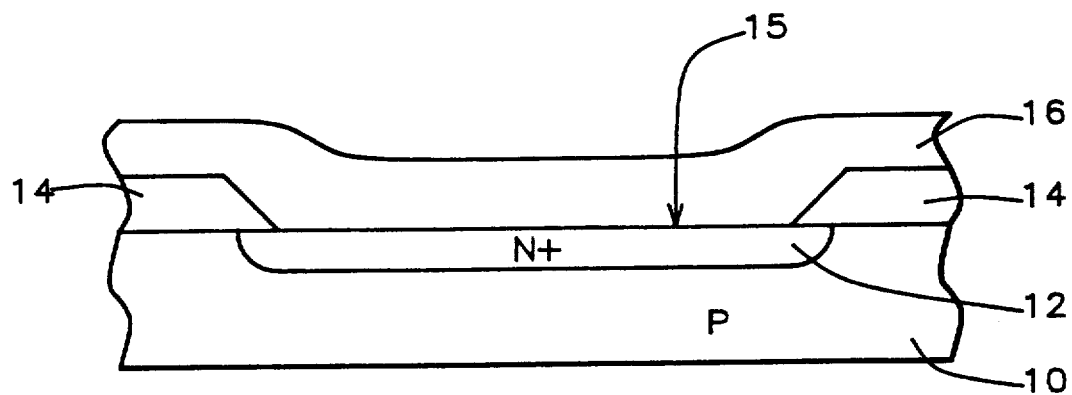
FIG. 1 schematically illustrates in cross-sectional representation a prior art process of forming a buried contact to source/drain or emitter regions.

Referring now more particularly to FIG. 1 there is shown the conventional buried contact process. Overlying silicon substrate 10 there has been deposited a layer of silicon dioxide 14. Contact opening 15 has been formed according to conventional lithography and etching techniques. Doped polysilicon layer 16 is deposited over silicon dioxide layer 14 and within the contact opening 15. The buried layer, which could be a source/drain region 12 is formed by outdiffusion from the doped polysilicon layer 16. A problem with this conventional method is that when the surface of the silicon substrate is exposed via the contact opening 15, native silicon oxide forms on the surface of the substrate 10. This results in some residual silicon dioxide islands in the polysilicon/silicon crystal interface which increases the contact resistance.

Figure 2:
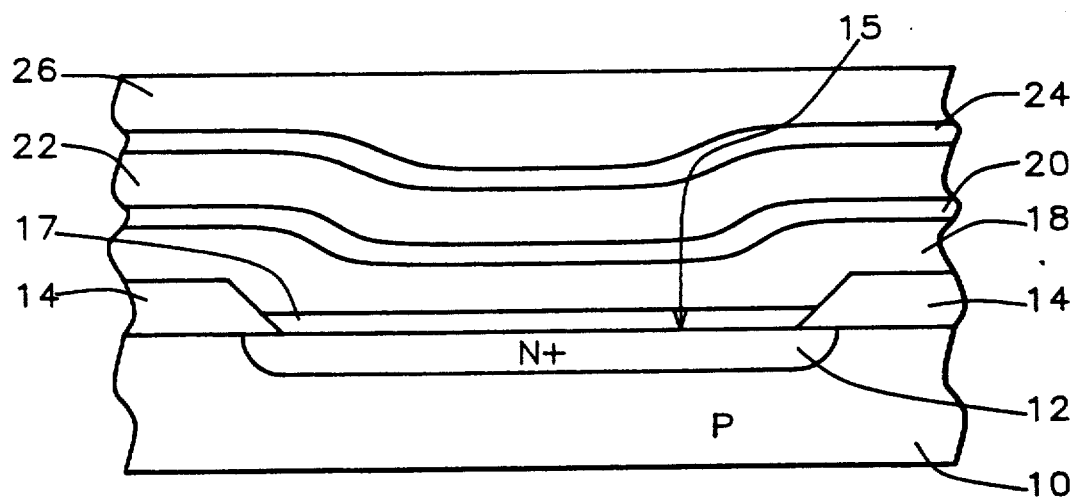
FIG. 2 and 3 schematically illustrates a cross-sectional representation of a preferred embodiment for forming a buried contact, in general, according to the invention.

Referring now to FIG. 2, there is illustrated the process of the present invention. The process of the invention is useful for formation of polysilicon emitters in the bipolar field and for polysilicon buried contacts to source/drain regions in field effect devices, in general for example, in a static random access memory (SRAM). FIG. 2 is an illustration of an N region 12 device portion of an partially completed integrated circuit in which there is a monocrystalline semiconductor substrate 10. The semiconductor substrate 10 is preferably composed of silicon having a (100) crystallographic orientation. Silicon dioxide layer 14 had been blanket deposited or thermally grown over the surface of the substrate 10 by conventional techniques. This layer is patterned and etched as is conventional in the art to form an opening 15 to the surface of the silicon substrate 10 over the region where the buried contact will be formed.

Where the silicon surface has been exposed, a layer of native silicon oxide forms. This native oxide is removed with a dilute water solution of hydrofluoric acid. The wafer is rinsed with de-ionized water. When the wafer is removed from the rinse, some native oxide 17 is formed again on the silicon surface. This native oxide layer is between about 10 to 50 Angstroms thick. The wafer is spin dried, then put immediately into a low pressure chemical vapor deposition (LPCVD) apparatus. Silane (SiH$_4$) is applied to form a layer 18 which is 700 to 1000 Angstroms in thickness. A deposition temperature of less than about 550° C. results in a layer of amorphous silicon. A temperature of about 600° or more ° C. results in a polycrystalline silicon. For easier deposition rate control, this layer 18 can be deposited undoped.

A thin layer 20 of native silicon oxide is formed on top of layer 18 either by adding an oxidizer to the LPCVD chamber or by removing the wafer from the chamber and exposing it to ambient air for a few minutes between about 20 to 40 minutes. This native oxide layer 20 has a thickness of between about 10 to 30 Angstroms. This layer should not be more than about 50 Angstroms thick or it may not be completely removed in later steps. It should be more than about 5 Angstroms in thickness.

The preceding two steps are repeated as needed to produce polysilicon (or amorphous silicon) layer 22, native oxide layer 24, and polysilicon (or amorphous silicon) layer 26. Polysilicon is preferred over amorphous silicon because it is desired that the grains be small and the grain boundaries many so that they form paths for the movement of silicon oxide gas from the thin silicon oxide layers during the annealing step. If amorphous oxide is deposited, it is changed to polysilicon before or during the annealing process. The grains will be larger and therefore, fewer paths will exist for the outgassing of the silicon oxide gas.

Each silicon layer is between about 700 to 1000 Angstroms thick and each native oxide layer is between about 10 and 30 Angstroms thick. These layers 18, 22, and 26 must be conductively doped by ion implantation or PoCl$_3$ reflow before or after the following annealing step. Implantation dosage should be greater than about 1 E14 Kev.

Figure 3:
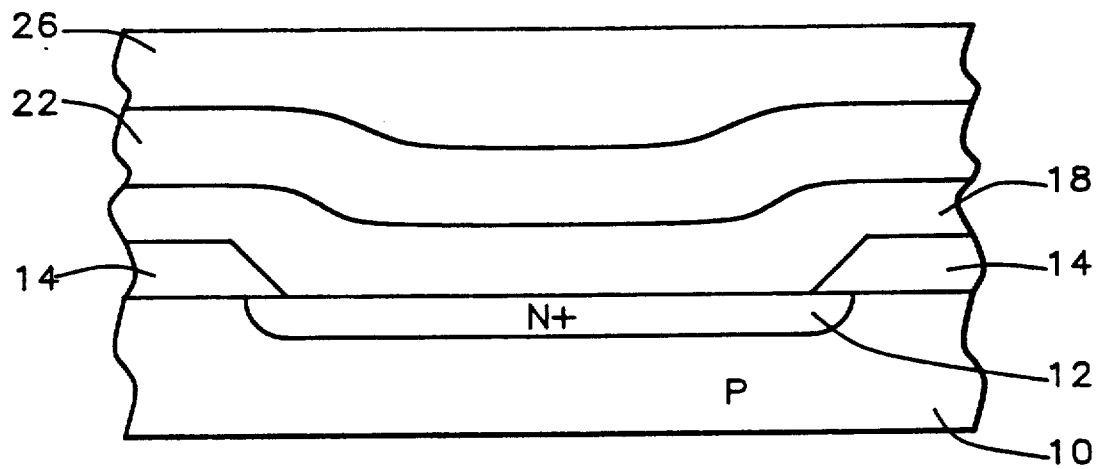

The wafer is annealed at more than about 800° C. and preferably between 900° to 1000° C. The anneal is performed at a low pressure of less than about 1 mtorr and for more than about 30 minutes. This causes the silicon oxide gas within the thin native oxide layers 17, 20, and 24 to be exhausted through the polysilicon grain boundaries, leaving only the polycrystalline silicon layers 18, 22, and 26 within the opening 15. The reaction is: SiO$_2$+Si (solid) —>SiO$_x$ (gas), where x probably equals about 1. Any amorphous silicon would be changed to polycrystalline before or during this process. This anneal also causes the formation of the buried region 12 due to out diffusion from the conductively doped layers 18, 22 and 26. This results in a buried contact to the region 12 as seen in FIG. 3.

Figure 4:
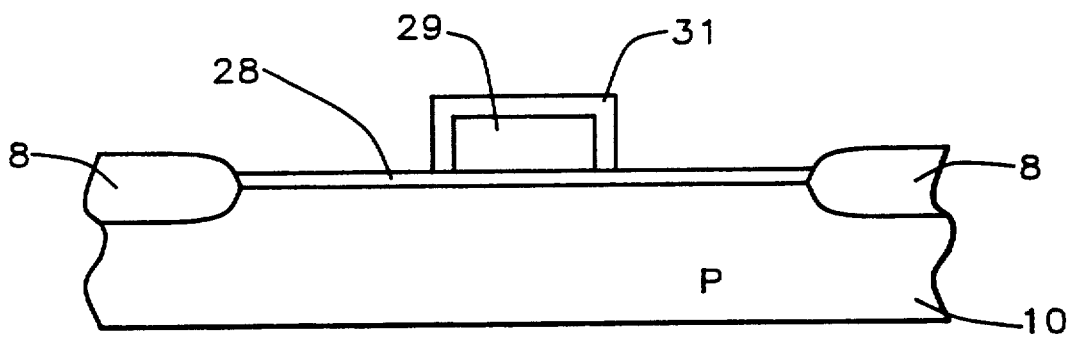
FIG. 4 through 6 schematically illustrates a cross-sectional representation of a second preferred embodiment for forming a buried contact according to the present invention.
Figure 5:
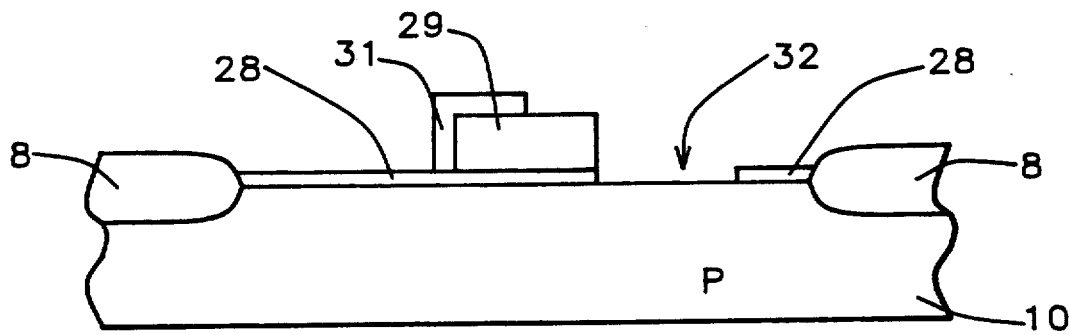
Figure 6:
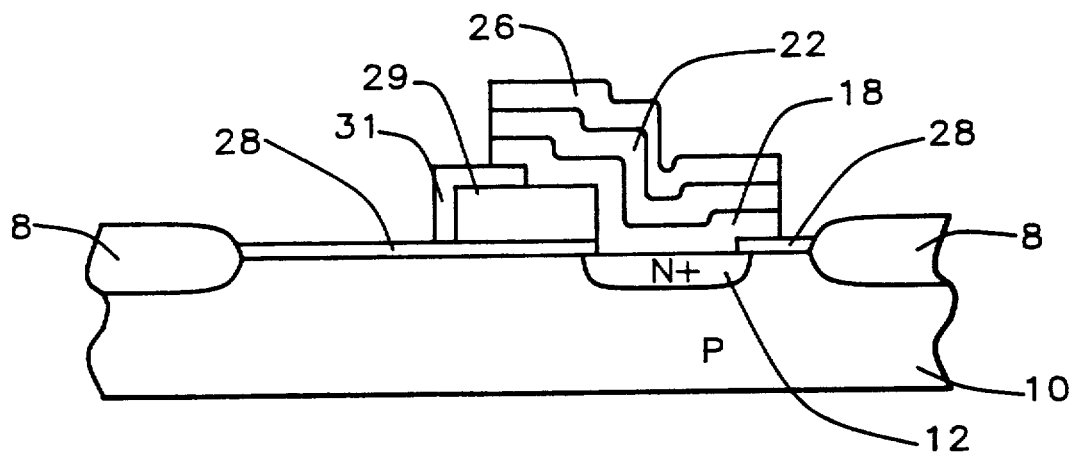

Referring now more particularly to FIG. 4 through 6, there is illustrated a process for forming another type of buried contact. FIG. 4 shows a monocrystalline silicon surface of substrate 10 with recessed silicon oxide regions 8 formed as is conventional in the art. A gate dielectric layer 28 is formed on the silicon surface by thermal oxidation. A polysilicon gate electrode layer 29 is formed thereover. The layers 28 and 29 are patterned by anisotropic etching to form the gate dielectric and gate electrode structure of FIG. 4. A layer 31 of silicon oxide is formed thereover by thermal oxidation.

To form the buried contact, a mask is applied and the silicon oxide layers 31 and 28 are etched to provide contact opening 32 as shown in FIG. 5. The N+ buried region 12 and buried contact 18, 22, and 26 is formed as described in the FIG. 2 and 3 embodiment and as shown in FIG. 6. If the layers 18, 22, and 26 are amorphous polysilicon, the wafer should be annealed first at between about 600° to 650° C. to change the amorphous silicon into polysilicon. Then the wafer is annealed a second time; this time to remove the native silicon oxide layers, in a low pressure furnace at about 900° C. If the layers 18, 22, and 26 are formed by polysilicon deposition, there are two doping alternatives. In the first alternative, all layers are deposited undoped. The wafer is annealed at about 900° C. to remove the native silicon oxide layers, then implantation of phosphorus, arsenic, or other ions is performed to dope the polysilicon layers. The wafer is heated to above 900° C., depending upon needed depth, to drive in the ions into the buried contact. In the second alternative, the layers 18, 22, and 26 are in situ doped, then annealed at about 900° C. both to remove the native oxide and to drive in the doping concentration into the buried contact.

Figure 7:
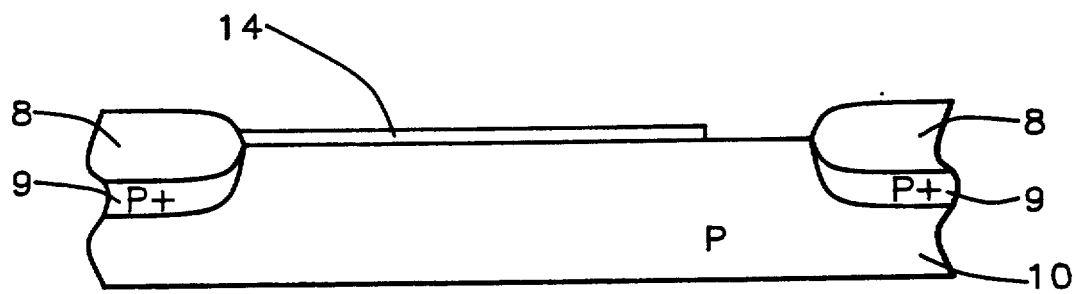
FIG. 7 through 10 schematically illustrates a cross-sectional representation of a third preferred embodiment for forming a buried contact to a source/drain region according to the present invention.

Referring now more particularly to FIG. 7 through 10 there is shown a process for forming a buried contact to a source/drain of an MOSFET integrated circuit. FIG. 7 shows a monocrystalline silicon surface of substrate 10 with recessed silicon oxide regions 8 and diffused P+ type regions 9 thereunder isolating this surface from other such regions. These are formed as is known in the art. The layer of silicon oxide 14 as shown in FIG. 1 through 3 is formed thereover, in this example by thermal oxidation technique. The layer 14 is patterned as described in the FIG. 2 & 3 embodiment to complete FIG. 7.

Figure 8:
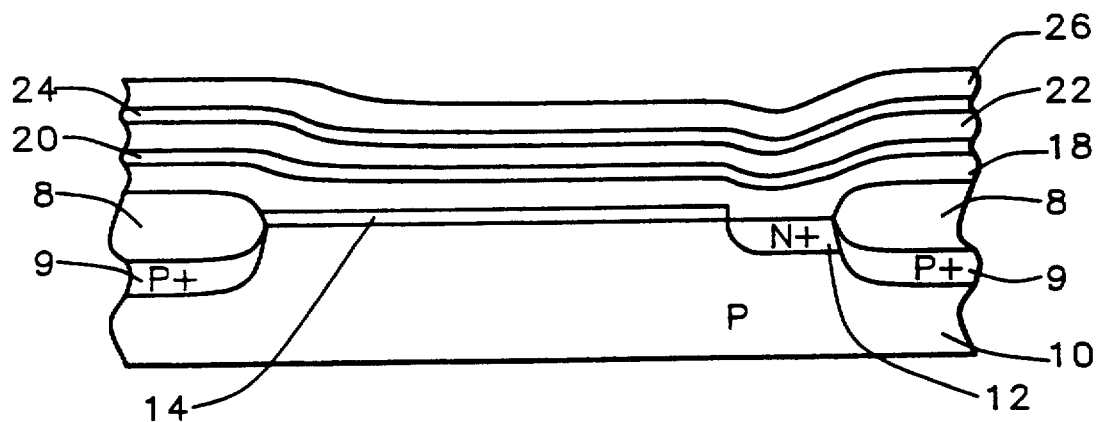

The N+ buried region 12 and buried contact 18, 22, and 26 is formed as described in the FIG. 2 and 3 embodiment and as shown in FIG. 8.

Figure 9:
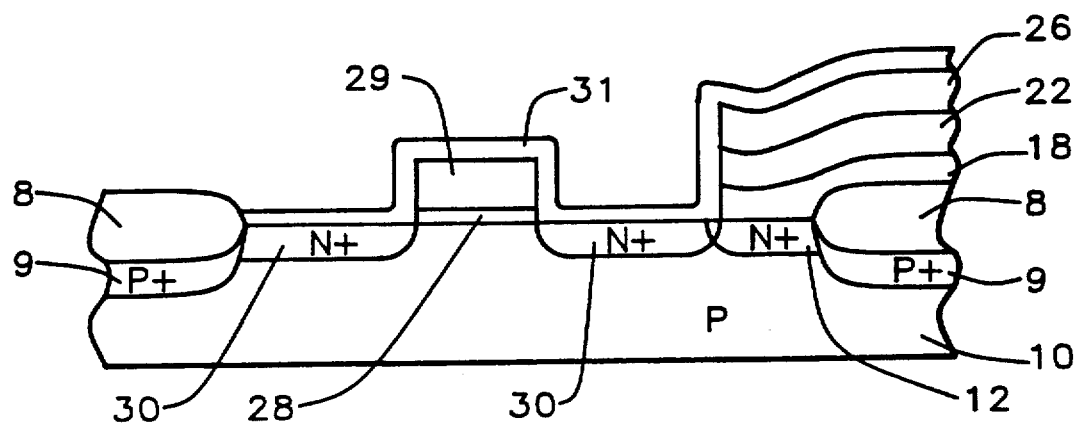

Referring to FIG. 8 and 9, there is shown the formation of the gate and source/drain device structure. The layer 14 is removed. A gate dielectric layer 28 is formed on the silicon surface by thermal oxidation. A polysilicon gate electrode layer 29 is formed thereover. The layers 28 and 29 are patterned by anisotropic etching to form the gate dielectric and gate electrode structure of FIG. 8. A layer 31 of silicon oxide is formed thereover by thermal oxidation. Finally, the source/drain ion implantation is accomplished using the gate structure and buried contact structure as the mask to form the N+ source/drain regions 30. A heating step is performed to complete the source/drain buried contact structure by movement of the buried region 12 into the source/drain region 30 as is shown in FIG. 9. This implantation can be phosphorus or arsenic to produce N+ regions.

Figure 10:
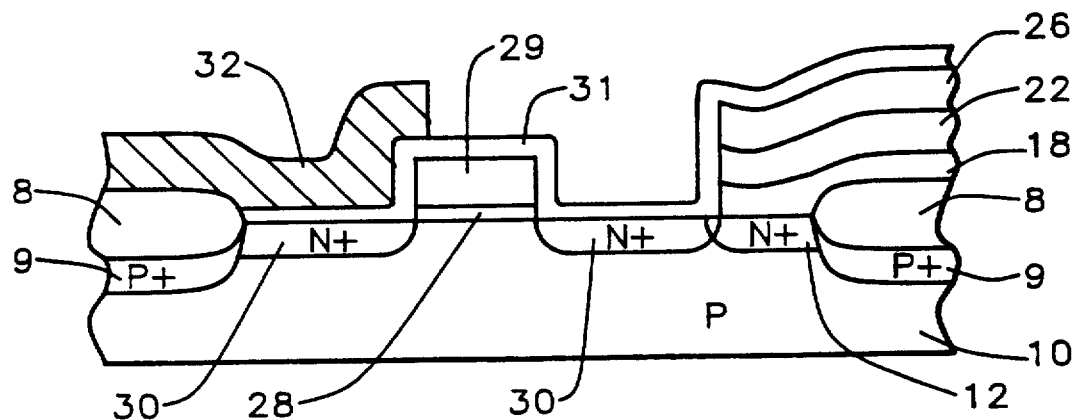

FIG. 10 shows the completed MOS FET buried contact structure with the contacts completed. Openings are made to the nonburied contacted source/drain regions 30 through the insulator layer 31, such as the region on the left hand side of the FIG. 10. A blanket deposit of a metal or conductive polysilicon layer 32 is formed thereover. It is then patterned to form the contact to the region 30. The other regions 30 are contacted by the buried region 12 and through it to the buried contact 18, 22, 26 itself.

Note that the FIGS. 7 through 10 illustrate an N channel MOSFET integrated circuit device. However, it is well understood by those skilled in the art that a P channel FET integrated circuit device could be formed by simply substituting opposite polarities to those given for the N channel embodiment. Also, in a similar way, a CMOS FET could be formed by making both N channel and P channel devices upon the same substrate.

Figure 11:
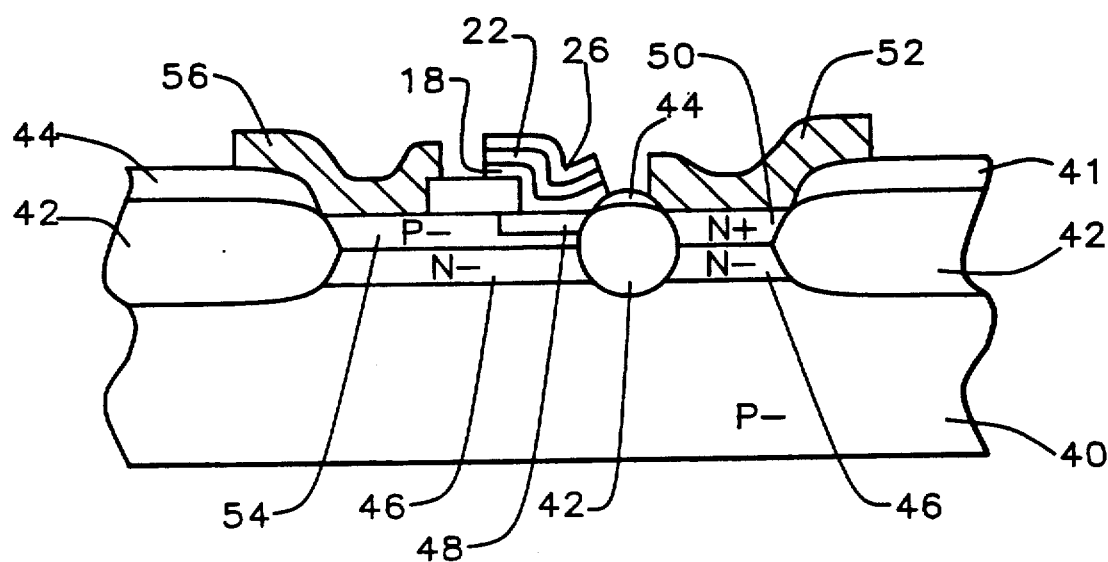
FIG. 11 schematically illustrates a resulting bipolar transistor having an emitter buried contact structure.

Referring now to FIG. 11, there is shown a Bipolar transistor integrated circuit wherein at least the emitter region and buried contact has been formed according the another embodiment of the present invention. A bipolar integrated circuit device could be formed as described in *VLSi Technology*, International Edition, ed. by S. M. Sze, McGraw-Hill Book Co., NY, N.Y., c.1988, 1983 by Bell Telephone Laboratories, Inc., pp.500-502. FIG. 11 shows a monocrystalline, lightly doped p-type silicon substrate 40, isolation oxide regions 42 and 44, and n-epitaxial layer 46. The emitter region 48 and buried contact 18, 22, and 26 are formed as described in the FIG. 2 and 3 embodiment. In this case, the multilayer polysilicon buried contact 18, 22, and 26 form the emitter contact of this bipolar transistor integrated circuit. Collector 50, collector contact 52, base 54, and base contact 56 complete the contacts of the bipolar integrated circuit device.

While the invention has been particularly shown and described with reference to the preferred embodiments thereof, it will be understood by those skilled in the art that various changes in form and details may be made without departing from the spirit and scope of the invention. For example, combinations of bipolar and MOS FET devices could be formed using the principals of this invention on the same integrated chip.

What is claimed is:

1. The method of forming a small crystalline grained multilayer, polysilicon buried contact to a buried region comprising:

providing on a semiconductor substrate a layer of silicon oxide through which an opening has been formed to said semiconductor substrate at the location of said buried contact;

removing native silicon oxide formed within said opening by using hydrofluoric acid, a de-ionized water rinse, and spin dry and immediately transferring said semiconductor substrate into a silicon deposition chamber;

depositing at least one first layer of silicon over said layer of silicon oxide and within said opening in direct contact to said silicon substrate;

forming at least one layer of native silicon oxide on top of said silicon layer having a thickness of less than about 30 Angstroms;

forming a second silicon layer over said native silicon oxide layer; and annealing said semiconductor substrate causing silicon oxide gas from the chemical breakdown of said native silicon oxide layer to be exhausted and effective removal of said thin native silicon oxide layer, causing the transformation of any amorphous silicon into said small crystalline grained polysilicon and causing the completion of said buried contact to said buried region.

2. The method of claim 1 wherein said first layer of silicon is amorphous silicon as deposited and is between about 700 to 1000 Angstroms in thickness.

3. The method of claim 1 wherein said first layer of silicon is polycrystalline silicon as deposited and is between about 700 to 1000 Angstroms in thickness.

4. The method of claim 1 wherein said first and second layers of silicon are undoped and are later doped by ion implantation.

5. The method of claim 1 wherein said first and second layers of silicon are in situ doped.

6. The method of claim 1 wherein said native silicon oxide layer is formed by adding oxidizer to the chemical vapor deposition chamber used in depositing said first layer of silicon.

7. The method of claim 1 wherein said native silicon oxide layer is between about 10 to 30 Angstroms in thickness and is formed by exposing the wafer to the atmosphere for a time of between 10 and 30 minutes at room temperature.

8. The method of claim 1 wherein there are formed multiple alternating layers of polysilicon and native silicon oxide layers over said first silicon layer and native silicon oxide layer.

9. The method of claim 1 wherein said annealing is done at a temperature of between about 800° to 1000° C. at a pressure of less than 1 mtorr. and for more than 30 minutes.

10. The method of claim 1 wherein there is a controlled native silicon oxide layer controllably grown upon the silicon surface before depositing said first silicon layer and the silicon oxide layer has a thickness between about 5 to 50 Angstroms.

11. The method of claim 1 wherein said buried region is a source/drain contact region and said buried contact electrically contacts said source/drain contact region.

12. The method of claim 1 wherein said buried region is an emitter region and said buried contact electrically contacts the emitter region.

13. The method of removing unwanted native silicon oxide from the surface of a buried, multilayer polysilicon contact comprising:
providing on a semiconductor substrate a layer of silicon oxide through which an opening has been formed to said semiconductor substrate at the location of said buried contact;
removing native silicon oxide formed within said opening wherein some new native silicon oxide having a thickness of less than about 30 Angstroms will be formed before the next step can be performed;
depositing a first polysilicon layer over said layer of silicon oxide and within said opening to said silicon substrate;
forming at least one layer of native silicon oxide on top of said polysilicon layer having a thickness of less than about 30 Angstroms;
wherein said one layer of native silicon oxide is formed by adding oxidizer to the chemical vapor deposition chamber used in depositing said polysilicon;
forming a second polysilicon layer over said native silicon oxide; and
annealing said semiconductor substrate causing silicon oxide gas from said native silicon oxide layers to be exhausted thereby removing all said unwanted native silicon oxide.

14. The method of claim 13 wherein said native silicon oxide within said contact opening is removed using hydrofluoric acid, a de-ionized water rinse, and spin dry.

15. The method of claim 13 wherein said layer of polysilicon is amorphous silicon and is 700 to 1000 Angstroms in thickness.

16. The method of claim 13 wherein said layer of polysilicon is polycrystalline silicon and is 700 to 1000 Angstroms in thickness.

17. The method of claim 13 wherein said layer of polysilicon is undoped and is later doped by ion implantation.

18. The method of claim 13 wherein said layer of polysilicon is in situ doped.

19. The method of claim 13 wherein said native silicon oxide layer is 10 to 30 Angstroms in thickness and is formed by exposing the wafer to the atmosphere.

20. The method of claim 13 wherein there are formed multiple alternating layers of polysilicon and native silicon oxide.

21. The method of claim 13 wherein said annealing is done at a temperature of between 900° C. and 1000° C.

22. The method of forming a multilayer, polysilicon contact emitter in a bipolar integrated circuit comprising:
providing on a semiconductor substrate a layer of silicon oxide through which an opening has been formed to said semiconductor substrate at the location of said emitter;
removing native silicon oxide formed within said opening by using hydrofluoric acid, a de-ionized water rinse, and spin dry and immediately transferring said semiconductor substrate into a silicon deposition chamber;
depositing at least one layer of undoped polysilicon over said layer of silicon oxide and within said opening to directly contact said silicon substrate;
forming at least one layer of native silicon oxide on top of said undoped polysilicon layer having a thickness of less than about 30 Angstroms;
forming a second polysilicon layer on said one layer of native silicon oxide;
annealing said semiconductor substrate causing silicon oxide gas from said native silicon oxide layers to be exhausted through the grain boundaries of said first and second polysilicon layers;
doping by ion implantation said undoped polysilicon layer to form a said doped multilayer, polysilicon contact emitter layer;
ion implanting active device regions to be contacted by said emitter in said silicon substrate; and
heating the structure to form said emitter region in said silicon substrate and to contact said active device regions.

23. The method of forming a multilayer, polysilicon buried contact in a static random access memory (SRAM) comprising:
providing on a semiconductor substrate a layer of silicon oxide through which an opening has been formed to said semiconductor substrate at the location of said buried contact;
removing native silicon oxide formed within said opening;
depositing at least one layer of undoped polysilicon over said layer of silicon oxide and within said opening to directly contact with silicon substrate;
forming at least one layer of native silicon oxide on top of said undoped polysilicon layer having a thickness of less than about 30 Angstroms;
forming a second polysilicon layer on said one layer of native silicon oxide;
annealing said semiconductor substrate causing silicon oxide gas from said native silicon oxide layers to be exhausted;
doping by ion implantation said undoped polysilicon layer to form a said doped multilayer, polysilicon buried contact layer,
ion implantation active device regions to be contacted by said buried contact in said silicon substrate; and
heating the structure to form said buried contact region in said silicon substrate and to contact said active device regions.

* * * * *